(12) United States Patent
Taguchi et al.

(10) Patent No.: US 6,429,372 B1
(45) Date of Patent: Aug. 6, 2002

(54) SEMICONDUCTOR DEVICE OF SURFACE MOUNTING TYPE AND METHOD FOR FABRICATING THE SAME

(75) Inventors: Hideo Taguchi; Junichi Asada; Jun Omori; Toshikazu Mino; Naohisa Okumura; Hiroshi Shimoe; Toshitsune Iijima; Katsuhiko Oyama, all of Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/256,220

(22) Filed: Feb. 24, 1999

(30) Foreign Application Priority Data

Mar. 31, 1998 (JP) ............................. 10-087634

(51) Int. Cl.⁷ .............................................. H01L 23/28
(52) U.S. Cl. ...................... 174/52.4; 174/52.2; 257/783; 257/787
(58) Field of Search ................................ 174/52.2, 52.3, 174/52.4, 52.1; 361/783; 257/678, 684, 737, 738, 787, 693, 783, 786

(56) References Cited

U.S. PATENT DOCUMENTS

| | | | | |
|---|---|---|---|---|
| 5,045,921 A | * | 9/1991 | Lin et al. ...................... 357/74 |
| 5,293,068 A | * | 3/1994 | Kohno et al. ................. 257/676 |
| 5,384,689 A | * | 1/1995 | Shen ............................ 361/761 |
| 5,521,427 A | * | 5/1996 | Chia et al. .................... 257/666 |
| 5,536,969 A | * | 7/1996 | Matsuoka .................... 257/666 |
| 5,639,695 A | * | 6/1997 | Jones et al. .................. 437/209 |
| 5,679,978 A | * | 10/1997 | Kawahara et al. ........... 257/697 |
| 5,729,051 A | * | 3/1998 | Nakamura .................... 257/668 |
| 5,773,882 A | * | 6/1998 | Iwasaki ........................ 257/692 |
| 5,777,391 A | * | 7/1998 | Nakamura et al. ........... 257/778 |
| 5,844,168 A | * | 12/1998 | Schueller et al. ........... 174/52.4 |
| 5,894,107 A | * | 4/1999 | Lee et al. .................... 174/52.2 |
| 5,999,413 A | * | 12/1999 | Ohuchi et al. ............... 361/772 |
| 6,018,188 A | * | 1/2000 | Yusa ............................ 257/668 |
| 6,057,289 A | * | 6/2000 | Distefano .................... 257/732 |

* cited by examiner

*Primary Examiner*—Dean A. Reichard
*Assistant Examiner*—Carmelo Oliva
(74) *Attorney, Agent, or Firm*—Oblon, Spivak, McClelland, Maier & Neustadt, P.C.

(57) ABSTRACT

An IC chip and overhang portions are stuck to tape by an adhesive agent layer having elasticity. A plurality of solder balls are attached to the tape. By soldering the solder balls to a printed board, a semiconductor device is mounted. In the case where a temperature cycle has been caused, thermal stress occurs between the IC chip and the printed board or between the hangover portion and the printed board because of a difference in coefficient of thermal expansion between the IC chip or the hangover portion and the printed board. However, this thermal stress is absorbed by the elasticity of the adhesive agent layer. As a result, little thermal stress is applied to solder balls. Even if the above described temperature cycle is repeated, therefore, the solder balls are electrically connected to the printed board stably over a long period of time. In addition, the area of the tape is widened by the area of the hangover portions. Accordingly, a larger number of solder balls can be attached to the tape without reducing the size of each of the solder balls.

34 Claims, 12 Drawing Sheets

FIG.14

| KIND OF ADHESIVE AGENT | YOUNG'S MODULUS | JOINT STRENGTH |
|---|---|---|
| A(TR-9100) | 0.1MPa | OF NO USE |
| B(TSA-61) | 1MPa | 6.0 |
| C(DC-6910) | 3MPa | 8.32 |
| D(JCR6172) | 10MPa | 10.61 |
| E(TPN3) | 60MPa | 7.34 |

FIG.15

| KIND OF ADHESIVE AGENT | YOUNG'S MODULUS 65°C | TCT TEST (NG) | | | | | SIMULATION RESULTS (CYCLES) |
|---|---|---|---|---|---|---|---|
| | | 600 CYCLES | 700 CYCLES | 800 CYCLES | 900 CYCLES | | |
| A | 38MPa | 0/60 | 1/60 | 1/59 | 0/58 | | 13000 |
| B | 440MPa | 0/60 | 0/60 | 0/60 | 0/60 | | 3100 |
| C | 1500MPa | 0/120 | 8/119 | 39/111 | 34/72 | | 2400 |
| D | 2500MPa | 0/120 | 0/120 | 0/120 | 1/120 | | 2100 |
| E | 3800MPa | 0/120 | 0/120 | 0/120 | 0/120 | | 1700 |

SEMICONDUCTOR DEVICE OF SURFACE MOUNTING TYPE AND METHOD FOR FABRICATING THE SAME

BACKGROUND OF THE INVENTION

1. Field of the Invention

The present invention relates to a semiconductor device of surface mounting type having a BGA (Ball Grid Array) structure which is one kind of IC package, and relates to its fabrication method.

2. Description of the Related Art

In recent years, semiconductor devices are made to become higher in integration and functions, as the performance of electronic apparatuses becomes higher. Such higher integration and functions increase the total number of external terminals. The number of terminals (pins) is increased more and more. Such an advance of increased terminals causes a decrease in external terminal pitch. In packages such as the QFP (Quad Flat Package) of conventional semiconductor devices, therefore, there have occurred problems such as lowering in external terminal strength or aggravation in positional precision at the time of mounting.

In order to avoid the above described problems, therefore, there has been developed a semiconductor device using a plastic substrate called BGA, which is a package of surf ace mounting type having solder balls instead of external terminals of the package.

FIG. 1 is a sectional view showing a configuration example of a conventional semiconductor device of BGA type. An element plane of an IC chip (semiconductor chip) 1 is stuck to a thin chip mounting substrate 3 (which may be replaced by tape). The IC chip 1 is electrically connected to the chip mounting substrate 3. On a back face of the chip mounting substrate 3, a plurality of solder balls (ball electrodes) 4 are attached in a matrix form. These solder balls 4 are electrically connected to the IC chip 1 via wiring of the substrate 3. The semiconductor device is mounted on a printed board (mounting board) 5 by soldering the solder balls 4 onto the printed board 5.

If the printed board 5 having a semiconductor device of the conventional BGA structure mounted thereon as described above is housed in a casing or the like of an electronic apparatus and actually used, the temperature becomes high when the electronic apparatus is operating and the temperature returns to normal when not operating. A temperature cycle is thus generated. By this temperature cycle, therefore, the printed board 5 and the semiconductor substrate mounted thereon are warmed and cooled. At that time, a coefficient of thermal expansion (3.5 ppm) of the IC chip 1 made of silicon is different from a coefficient of thermal expansion (18 ppm) of the printed board 5 made of resin. In addition, the IC chip 1 is stuck to the substrate 3 securely.

Eventually, therefore, thermal stress caused by the above described difference in coefficient of thermal expansion is applied to the solder balls 4. Because of fatigue of a metal in the solder balls 4, a crack or the like is caused. This crack develops and results in breakdown of joint to the printed board 5. Thus there is a fear of occurrence of an electric open circuit. If the above described temperature cycle is repeated a large number of times, electric connection between the printed board 5 and the semiconductor device becomes different from predetermined connection. There is a problem that a failure is caused by this.

Furthermore, the area of the substrate 3 cannot be made wider than the area of the IC chip 1. Therefore when the IC chip 1 has a large number of functions and consequently a large number of solder balls 4 must be attached to the substrate 3, the size of each of the solder balls must be made small. As a result, it becomes necessary to fabricate solder balls of various sizes. This results in a problem that the fabrication becomes troublesome and the cost of the solder balls 4 becomes high.

SUMMARY OF THE INVENTION

The present invention has been made in order to solve the above described problems of the conventional technique. An object of the present invention is to provide a semiconductor device and its fabrication method, capable of stably maintaining electric connection between a printed board and solder balls even if a temperature cycle is repeated, and capable of attaching a large number of solder balls without reducing the size of the solder balls.

In order to achieve the above described object, there is provided a semiconductor device including a semiconductor chip, hangover portions formed by hardening resin on side planes of the semiconductor chips, insulative tape having signal wiring and ball electrodes electrically connected to the signal wiring on a main plane thereof, an adhesive agent layer having elasticity for sticking the semiconductor chips and the hangover portions to a back plane of the insulative tape, and insulative tape having signal wiring and ball electrodes electrically connected to the signal wiring on a main plane thereof, an adhesive agent layer having elasticity for sticking the semiconductor chips to a back plane of the insulative tape, and an electric connection portion for electrically connecting the semiconductor chips to the signal wiring of the insulative tape.

According to the invention, after ball electrodes of semiconductor chips are soldered to a printed board or the like and mounting is conducted, a temperature cycle is caused by operation and operation cease of the semiconductor chip. Since at this time the semiconductor chip made of silicon is different from the printed board made of resin in coefficient of thermal expansion, thermal stress occurs between them. According to the present invention, the adhesive agent layer has elasticity, and consequently the thermal stress is absorbed by the elasticity and it is not applied to the ball electrodes. As a result, little fatigue of a metal occurs in the ball electrodes. Since cracks are not generated, the ball electrodes do not come into an open state with respect to wiring of the printed board. Over a long period of time, therefore, electric connection between the semiconductor chip and the printed board is stably maintained via the ball electrodes. Furthermore, the area of the insulative tape can be increased by the area of the hangover portions as compared with the size of the semiconductor chip. As a result, a larger number of ball electrodes can be disposed on the insulative board without reducing the size of each of the ball electrodes.

In a preferred embodiment of the present invention, the adhesive agent layer has a Young's modulus value in the range of 1 MPa to 5000 MPa.

According to this embodiment, if the Young's modulus of the adhesive agent layer is smaller than 1 MPa, the elasticity of the adhesive agent layer is too great. When conducting wire bonding on the semiconductor chip to the insulative tape, therefore, the adhesive agent layer cannot support the insulative tape and consequently sufficient joint strength cannot be obtained. If the Young's modulus of the adhesive agent layer is larger than 5000 MPa, the elasticity of the adhesive agent layer is small. In this case, therefore, the stress caused between the semiconductor chip and the printed board by the temperature cycle cannot be absorbed. Consequently, fatigue of the metal in the ball electrodes advances in a short period of time, and the electric connection between the semiconductor chip and the printed board comes into an open state in a short period of time.

In a preferred embodiment of the present invention, the electric connection portion includes wires for connecting electrode pads of the semiconductor chip to electrode pads disposed on the signal wiring of the insulative tape, and a seal portion seals the electric connection portion with seal resin so as not to expose the wires.

According to this embodiment, the wires are buried within the seal resin, and are not exposed. Therefore, the wires are not cut, and the electric connection between the semiconductor chip and the insulative board can be stably maintained over a long period of time.

In a preferred embodiment of the present invention, resin forming the overhang portions of the semiconductor chip is resin of the same family as resin forming the adhesive agent layer.

According to this embodiment, resin forming the overhang portions of the semiconductor chip belongs to the same family as resin forming the adhesive agent layer. Therefore, stickiness between them is improved, and exfoliation between them can be prevented.

In a preferred embodiment of the present invention, each of the overhang portions of the semiconductor chip has a thickness of at least 0.1 mm.

If according to this embodiment each of the overhang portions has a thickness of at least 0.1 mm at the time of a test conducted when construction of the semiconductor device has been completed, contact force of at least 10 gf is obtained to connect the solder ball to a test socket terminal. It is possible to connect the ball electrode to the test terminal securely and conduct the test without hindrance.

In a preferred embodiment of the present invention, upper corners of the hangover portions of the semiconductor chip are rounded off.

According to this embodiment, upper corners of the hangover portions are rounded off. Therefore, it is possible to prevent this portion from being caught by something and broken. In addition, the amount of resin required to form the overhang portions can be reduced by an amount of portions rounded off.

In a preferred embodiment of the present invention, the overhang portions of the semiconductor chip are made thinner in thickness than the semiconductor chip.

According to this embodiment, the thickness of the hangover portions is made thinner than the thickness of the semiconductor chip, and they are aligned on the adhesive agent layer side. Then the height of the top plane of the semiconductor chip becomes higher than the height of the overhang portions. Although the load is applied to the top plane of the semiconductor device at the time of the test of the semiconductor device, therefore, non-uniform load is not applied to the overhang portions which are hard to be flattened, but all of the load is applied to the top plane of the semiconductor chip uniformly. As a result, the overhang portions are prevented from being cracked and destroyed thereby.

In a preferred embodiment of the present invention, each of the overhang portions of the semiconductor chip has a Young's modulus value in the range of 1 MPa to 5000 MPa.

According to this embodiment, the Young's modulus value of the overhang portions is in the same range as that of the adhesive agent layer. The difference of thermal stress caused by the temperature cycle is absorbed. Destruction or the like of the overhang portions can be avoided over a long period of time.

In a preferred embodiment of the present invention, the overhang portions are formed on two side planes or four planes of the semiconductor chip.

According to this embodiment, insulative tape having an area larger than that of the semiconductor chip can be used whichever the hangover portions are provided on two side planes of the semiconductor chip or the hangover portions are provided on four side planes of the semiconductor chip. A larger number of ball electrodes can be attached without changing the size of the ball electrodes.

In a preferred embodiment of the present invention, a part of the semiconductor chip is buried in the adhesive agent layer.

According to this embodiment, a part of the semiconductor chip is buried in the adhesive agent layer. Accordingly, the semiconductor chip supports external force exercised in its horizontal direction at the internal wall of the adhesive agent layer. Therefore, the semiconductor chip is prevented from being shifted with respect to the adhesive agent layer. A package having strong mechanical strength can thus be obtained.

In a preferred embodiment of the present invention, the ball electrodes are disposed on the insulative tape so that the ball electrodes will not be disposed on positions extending over both the semiconductor chip and the hangover portions.

According to this embodiment, since the semiconductor chip is different in characteristics from the overhang portions, the coplanarity at the boundary between the semiconductor chip and the hangover portions is not maintained when the tape is deformed. If ball electrodes are attached in this portion, therefore, the ball electrode gets out of place. According to this embodiment there are no ball electrodes in this portion. As a result, the ball electrode does not get out of place.

In a preferred embodiment of the present invention, a mark for positioning at the time of mounting is provided on either a back plane of the semiconductor chip or said overhang portions.

According to this embodiment, a position of a solder ball of the semiconductor chip and a pattern of the mounting board can be aligned to a predetermined position by watching from the back plane side of the semiconductor chip and using the positioning mark as a reference. As a result, the mounting efficiency can be improved.

In a preferred embodiment of the present invention, a diameter of each of the ball electrodes is larger than a diameter of each of circular ball electrode mounting portions formed on the main plane of the insulative tape.

According to this embodiment, the diameter of the ball electrode is larger. In a test conducted when the construction of the semiconductor device is finished, a test socket terminal easily grasps the ball electrode. The test can be thus conducted smoothly.

In a preferred embodiment of the present invention, an edge of a solder resist stuck to the main plane of the insulative tape is located in a position retreated from an edge of an opening portion for wire bonding formed in the insulative tape for the purpose of forming the electric connection portion.

According to this embodiment, a difference in level is provided between the surface of the insulative board ranging from the opening portion to the solder resist and the solder resist. When applying seal resin to the electric connection portion of the opening portion, therefore, it is possible to dam up the seal resin by the level difference and prevent the seal resin from flowing out to unnecessary parts.

In a preferred embodiment of the present invention, a gap between a top plane of the electrode pads and the seal portion is at least 0.05 mm, when the ball electrodes are soldered to electrode pads on a mounting board and thereby the semiconductor device is mounted on the mounting board.

According to this embodiment, the gap between the top plane of the electrode pad on the mounting board and the seal portion is at least 0.05 mm. When cleaning the semiconductor device with a flux or the like at the time of mounting, therefore, the flux flows through the gap smoothly. It is thus possible to prevent the flux from being accumulated and left in the gap after the cleaning.

In a preferred embodiment of the present invention, the wires are buried on the inside of at least 0.01 mm from the surface of the seal resin of the seal portion.

According to this embodiment, the wire is covered by seal resin of at least 0.01 mm. It is thus possible to prevent the wire from being exposed to the outside due to wear of the seal resin or the like and being cut. The reliability of the wire can be ensured.

In a preferred embodiment of the present invention, a plurality of electrode pads lining up in a straight line on the insulative tape and a plurality of electrode pads lining up in a straight line on the semiconductor chip are arranged in the same direction, and the plurality of electrode pads of the insulative tape are opposed to corresponding electrode pads of the plurality of electrode pads of the semiconductor chip with the same distance therebetween.

According to this embodiment, all wires can be disposed in parallel when connecting a plurality of electrode pads of the insulative tape to a plurality of electrode pads of the semiconductor chip. Therefore, it is possible to minimize the area required for the wire bonding and reduce the cost of the tape.

In a preferred embodiment of the present invention, each of electrode pads on the signal wiring takes the shape of a rectangle.

According to this embodiment, the load of the bonding tool is applied stably, and the required electrode pad area can be minimized.

In a preferred embodiment of the present invention, a mark for positioning at the time of wire bonding which can be watched from an opening portion for wire bonding or a dedicated opening portion provided in the insulative tape is indicated on the semiconductor chip.

According to this embodiment, the precision of the wire bonding can be raised by conducting the wire bonding with this mark as a reference.

In a preferred embodiment of the present invention, a plurality of electrode pads are arranged in a straight line near a center of an element plane of the semiconductor chip.

According to this embodiment, a wire bonding hole opened to the insulative board is closed by the element plane of the semiconductor chip when the semiconductor chip has been stuck to the insulative tape. When sealing this wire bonding hole with seal resin, therefore, the resin does not go round onto the top plane of the insulative tape, and the insulative tape can be cut smoothly.

In a preferred embodiment of the present invention, a plurality of electrode pads are arranged near a center of an element plane of the semiconductor chip so as to form a cross, and a wire bonding hole is opened in the insulative tape so as to form a cross.

According to this embodiment, a, large number of electrode pads can be disposed in a cross form in the case where the semiconductor chip is provided with a larger number of functions. It is thus possible to cope with a larger number of pins.

In a preferred embodiment of the present invention, a mark for positioning at the time of chip mount/wire bonding/ solder ball mounting is provided outside a signal wiring area on the insulative tape.

According to this embodiment, the mark for positioning is located outside the signal wiring on the insulative tape. Therefore, this mark does not become a,hindrance, and the degree of freedom of wiring in the insulative tape can be improved.

In a preferred embodiment of the present invention, a function of the semiconductor chips is selected according to the number and positions of ball electrodes mounted on ball mounting portions provided in the insulative tape.

According to this embodiment, whether a ball electrode is attached or not acts as a switch. Thus the function of the semiconductor chip is, selected. As a result, the same semiconductor chip can be used for a plurality of functions separately.

In a preferred embodiment of the present invention, a function of the semiconductor chip is selected according to the number and positions of wires for connecting the electrodes arranged on the semiconductor chip to the electrode pads arranged on the insulative tape.

According to this embodiment, whether a ball electrode is attached or not acts as a switch. Thus the function of the semiconductor chip is selected. As a result, the same semiconductor chip can be used for a plurality of functions separately.

Furthermore, in order to achieve the above described object, there is provided a method for fabricating the above described semiconductor device.

In a preferred embodiment of the present invention, the method includes the step of applying an adhesive agent of the same family as resin forming the overhang portions to side planes of the semiconductor chip and then forming the overhang portions.

According to this embodiment, the overhang portions are formed of resin belonging to the same family as the adhesive agent, on side planes of the semiconductor chip having the adhesive agent applied thereto. Therefore, close adhesion between the side planes of the semiconductor chip and the resin is enhanced. Thus the hangover portions can be jointed to the side planes of the semiconductor chip securely.

In a preferred embodiment of the present invention, the method includes the step of conducting wire bonding of the wires to electrode pads of each of the semiconductor chips and then conducting wire bonding of the wires to the electrode pads disposed on the signal wiring of the insulative tape.

According to this embodiment, the wire is subjected earlier to wire bonding to an electrode pad of the semiconductor chip. The height of the bonding portion of the semiconductor chip side is high. The height of the bonding portion on the insulative tape side subjected to the second wire bonding can be made low. Therefore, the height of the wire can be constrained to be low. As a result, the height of the seal portion covering the wires can made low.

In a preferred embodiment of the present invention, the method includes the step of applying seal resin to the electric connection portion by moving a resin ejecting nozzle and thereby forming the seal portion.

According to this embodiment, the resin ejecting nozzle is light in weight and small in inertia. Therefore, the precision of the application range of the seal resin can be improved.

In a preferred embodiment of the present invention, the method includes the step of applying seal resin to the electric connection portion and then lowering the pressure around the seal resin.

According to this embodiment, the vicinity of the seal resin becomes a low pressure or vacuum, and air contained therein gets out. Thus, the density within the seal resin can be made uniform, and the quality can be improved.

In a preferred embodiment of the present invention, the method includes the step of lowering the pressure around the seal resin and then curing the seal resin.

According to this embodiment, air contained in the seal resin is put out and then the seal resin is cured. As a result, the seal portion having a uniform density and a good quality can be formed.

In a preferred embodiment of the present invention, the method includes the step of sealing the electric connection portion and then attaching the ball electrodes to the insulative tape.

According to this embodiment, the electric connection portion is sealed with resin earlier. When attaching the ball electrodes, therefore, the bonding electrode pads are not contaminated by the flux used at the time of attaching the ball electrodes. In addition, the ball electrodes are not contaminated by out-gas generated when curing the seal resin. The ball electrodes can be attached in a clean state.

In a preferred embodiment of the present invention, the method includes the step of bonding the wires to the electrode pads of the semiconductor chip and to the electrode pads of the insulative tape, and then sealing the electric connection portion with the seal resin.

According to this embodiment, the electric connection portion is sealed with resin. Therefore, the insulation performance is improved. Furthermore, it is possible to protect the wires of the electric connection portion from a corrosive substance and improve the durability of the electric connection portion.

In a preferred embodiment of the present invention, the wires are in the range of 20 to 40 $\mu$m in diameter.

According to this embodiment, the wires are in the range of 20 to 40 $\mu$m in diameter. For the stress generated by the temperature cycle, therefore, the wires do not break. In addition, it is possible to prevent the stress from being concentrated onto the semiconductor chip side or the insulative board side by the elasticity of the wires.

In a preferred embodiment of the present invention, the method includes the step of arranging a plurality of semiconductor chips in a direction perpendicular to a longitudinal direction of the insulative tape.

According to this embodiment, the density of arranging semiconductor chips per area of the insulative tape is improved as compared with the case where semiconductor chips of one column are arranged in a direction perpendicular to the longitudinal direction of the insulative tape. Accordingly, useless portions of the insulative tape can be eliminated. And the cost can be reduced.

In a preferred embodiment of the present invention, the method includes the step of arranging a plurality of semiconductor chips on the insulative tape so as to form a matrix, and the step of dicing the tape in a longitudinal direction of the tape, and then dicing the tape in a direction perpendicular to the longitudinal direction, and thereby cutting off the semiconductor chips separately.

According to this embodiment, the number of the semiconductor chips arranged in the longitudinal direction of the insulative tape is larger. By cutting the insulative tape first in the longitudinal direction and then cutting the tape in a direction perpendicular to the longitudinal direction, therefore, the number of times of dicing can be reduced.

In a preferred embodiment of the present invention, the method includes the step of hardening resin between the plurality of semiconductor chips arranged on the insulative tape, and the step of dicing the insulative tape together with the resin in the longitudinal direction of the tape, and then dicing the insulative tape together with the resin in a direction perpendicular to the longitudinal direction, and thereby cutting off the semiconductor chips separately.

According to this embodiment, space between a plurality of semiconductor chips on the insulative tape is filled up by resin so that the resin may be stuck to the side planes of the semiconductor chips. When each semiconductor chip is cut off by dicing the resin portion, the resin is jointed to side planes of each semiconductor chip and forms the overhang portions. In addition, if the interval between the semiconductor chips on the insulative tape is determined appropriately, the hangover portions of a desired size are formed by simply cutting the semiconductor chips as described above. As compared with the case where the semiconductor chips are not disposed at appropriate intervals and the hangover portions are not formed by simply cutting, it is possible to reduce the number of times of dicing and cutting loss, improve the working efficiency, and reduce the working cost.

In a preferred embodiment of the present invention, a line-up direction of electrode pads of the semiconductor chip coincides with the longitudinal direction of the insulative tape.

According to this embodiment, the number of the semiconductor chips arranged in the longitudinal direction of the insulative tape is larger. By aligning the line-up direction of the bonding bads with the longitudinal direction of the insulative tape, therefore, the wire bonding can be conducted along the longitudinal direction. The number of changes of direction in conducting the wire bonding on semiconductor chips of another column can thus be reduced.

In a preferred embodiment of the present invention, the tape is rotated by 90 degrees, and thereby the dicing direction is changed when dicing the insulative tape.

According to this embodiment, the cut direction can be changed by turning the tape by 90 degrees when cutting the insulative tape lengthwise and breadthwise. In addition only one blade for dicing is needed.

The nature, principle and utility of the invention will become more apparent from the following detailed description when read in conjunction with the accompanying drawings.

BRIEF DESCRIPTION OF THE DRAWING

In the accompanying drawings:

FIG. 14 is a table diagram showing relations between Young's modulus values of adhesive agents of five kinds and their joint strength values of wire bonding;

FIG. 15 shows life test results of the TCT test of solder balls of the semiconductor device illustrated in FIG. 2 and fabricated by using adhesive agents of five kinds;

DESCRIPTION OF THE PREFERRED EMBODIMENTS

Figure 1:
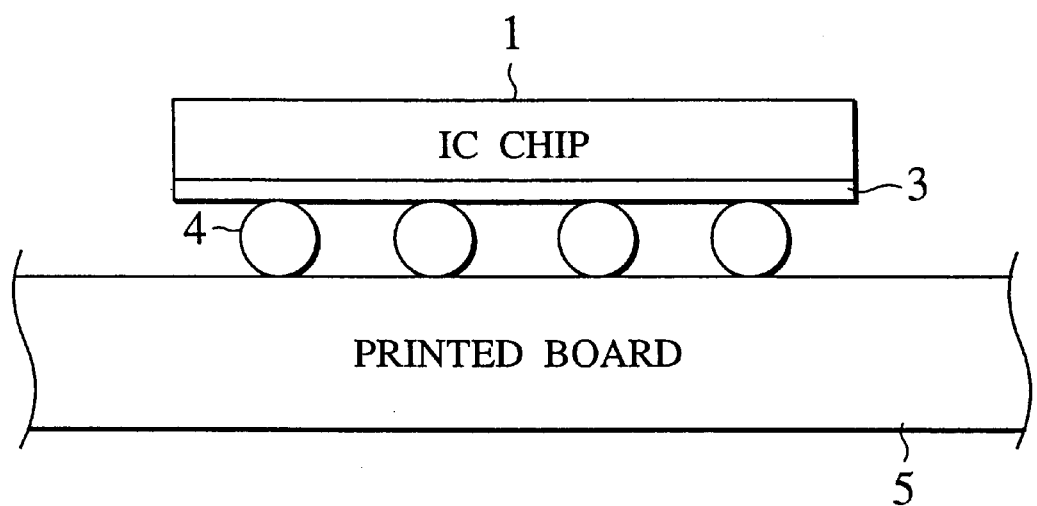
FIG. 1 is a sectional view showing a configuration example of a semiconductor device of a conventional BGA type.
Figure 2:
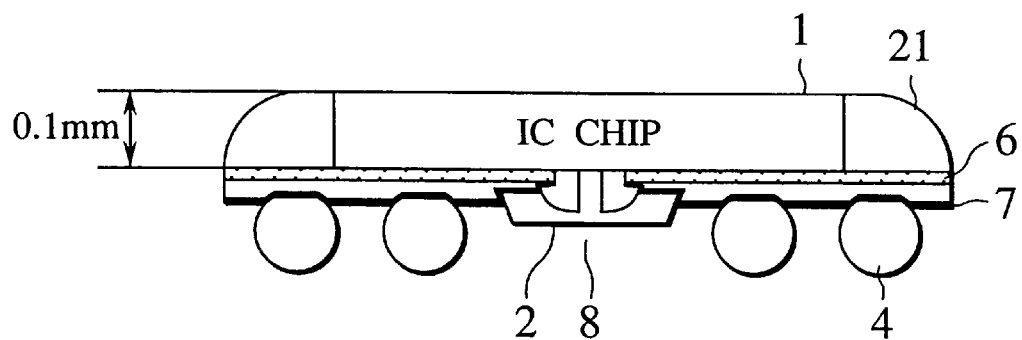
FIG. 2 is a sectional view showing an embodiment of a semiconductor device according to the present invention.

Hereafter, embodiments of the present invention will be described by referring to drawing. FIG. 2 is a sectional view showing an embodiment of a semiconductor device according to the present invention. Overhang portions 21 formed of resin are jointed to four side planes of the IC chip 1. An element plane of the IC chip 1 and bottom planes of the overhang portions 21 are stuck to tape, (polyimide tape) 7 by an adhesive agent layer 6 (such as epoxy adhesive agent HS-X20 (trade name)) having elasticity. The tape 7 has an opening portion (wire bonding hole). The IC chip 1 and the overhang portions 21 are stuck to the tape 7 so that a central part of the IC chip 1 may be positioned on the opening portion. On a plane of tape 7 opposite to the sticking plane, a wiring pattern made of copper or the like is formed. A plurality of solder balls 4 are attached to ball mounting portions of this wiring pattern by soldering. This IC chip 1 is electrically connected to the wiring pattern of the tape 7 by conducting wire bonding of the wires 2. Furthermore, the IC chip is electrically connected to the solder balls 4 via the wiring pattern. The above described opening portion of the tape 7 and the wires 2 are sealed by resin. A seal portion 8 (such as a silicone material JCR 6224T (trade name)) is thus formed.

As the resin forming the overhang portions 21, resin of the same family as the resin for forming the adhesive agent layer 6 is used. Stickiness of the overhang portions 21 with respect to the adhesive agent layer is improved. The overhang portions 21 are stuck to the adhesive agent layer 6 securely. Each of the overhang portions is provided with a thickness of at least 0.1 mm. At the time of a test conducted when construction of the semiconductor device has been completed, contact force of at least 10 gf is obtained to connect the solder ball 4 to a test socket terminal. It is possible to connect the ball electrode to the test terminal securely and conduct the test without hindrance. If the overhang portions are thinner than 0.1 mm, then this portion is bent and in some cases the solder ball 4 cannot be connected securely to the test socket terminal. In addition, upper corners of the hangover portions 21 are rounded off. Therefore, it is possible to prevent this portion from being caught by something and broken. In addition, the amount of resin required to form the overhang portions 21 is reduced by an amount of portions rounded off.

When forming the overhang portions 21, an adhesive agent of the same family as the resin forming the overhang portions 21 is applied to the side planes of the IC chip 21, and then the overhang portions 21 are formed. Thus the adherence between the side planes of the IC chip 1 and resin forming the overhang portions 21 is improved, and the overhang portions 21 are coupled to the side planes of the IC chip 21 securely.

Furthermore, the solder balls 4 are not attached just under boundaries between the IC chip 1 and the overhang portions 21. Even if the tape 7 is deformed by some cause, thereby the overhang portion 21 is bent with respect to the IC chip 1, and consequently the coplanarity of the IC chip 1 and the hangover portions 21 is not maintained, it is possible to prevent such a failure that the solder ball 4 gets out of place, because the solder balls are not attached under the boundaries.

Figure 3:
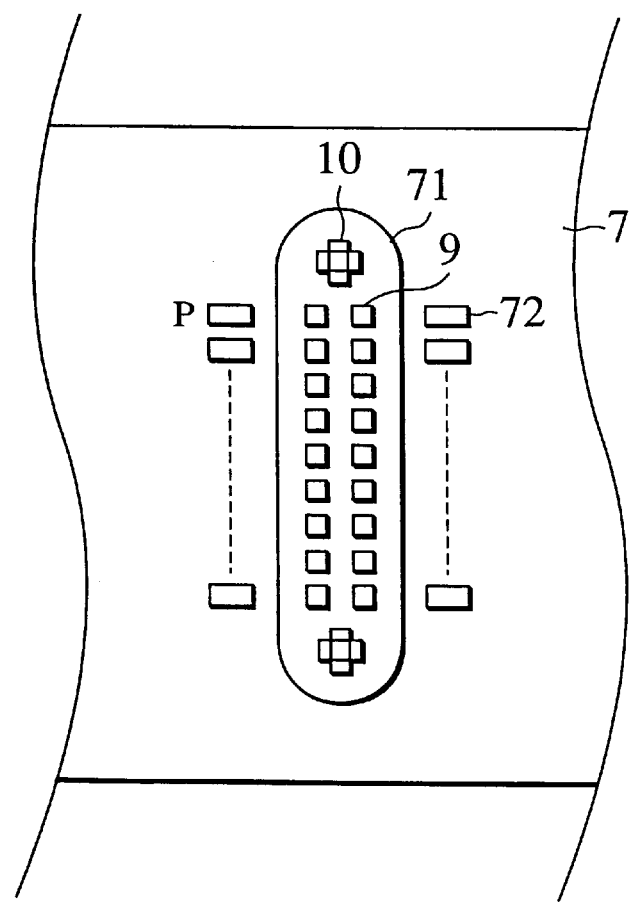
FIG. 3 is a top view obtained when an IC chip shown in FIG. 2 is positioned to stick the IC chip to tape.

FIG. 3 is a top view obtained when the IC chip 1 is positioned in order to bond the IC chip 1 to the tape 7. The IC chip 1 is positioned so that the central part of the element plane of the IC chip 1 may be located on an opening portion 71 formed in the tape 7. In the central part of the element plane of the IC chip 1, electrode pads 9 are disposed in two columns (center pad scheme). In addition, marks 10 for positioning are indicated outside the electrode pads 9. If the center pad scheme is adopted for the IC chip 1, the element plane of the IC chip 1 closes the opening portion 71. Accordingly, it is possible to prevent the seal resin from coming round to the back via the tape 7 when forming the seal portion 8. In a cut process, it is thus possible to cut the tape 7 easily and smoothly.

Furthermore, electrode pads 72 lining up in a straight line on the tape 7 and the bonding electrode pads lining up in a straight line on the IC chip 1 are arranged in the same direction. In addition, the electrode pads 72 on the tape 7 are opposed to corresponding bonding electrode pads 9 on the IC chip 1 with the same distance between. As a result, adjacent wires 2 can be disposed in parallel. It is thus possible to minimize the area of the tape required for the wire bonding and reduce the cost of the tape 7.

In addition, it is possible to provide option pads in the bonding electrode pads 9 of the IC chip 1 and the bonding electrode pads 72 of the tape 7. For example, an illustrated pad P is set to an option pad. If the option pad is connected to an electrode pad of the IC chip 1 by a wire 2, the semiconductor device is provided with a function A. Otherwise, the semiconductor device is provided with a function B. Thus the same IC chip 1 can be used in different ways.

In addition, since the positioning marks 10 indicated on the element plane of the IC chip 1 can be watched from the opening portion 71, positioning of the wire bonding can be conducted easily. The marks 10 may be watched from a dedicated opening portion provided in the tape 7.

Figure 4:
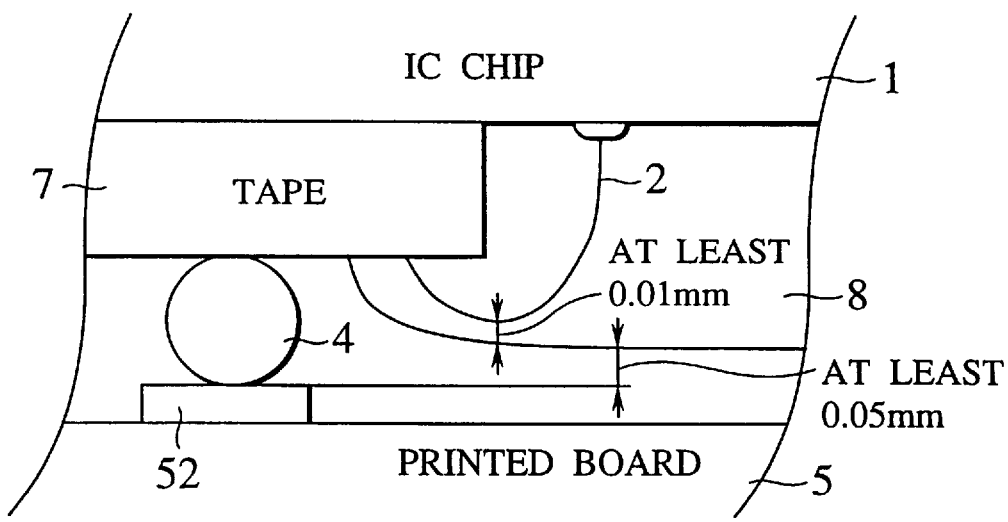
FIG. 4 is an enlarged sectional view showing the vicinity of an electric connection portion between the IC chip and the tape illustrated in FIG. 2.

FIG. 4 is an enlarged sectional view of a vicinity of an electric connection portion between the IC chip 1 and the tape 7 illustrated in FIG. 2. The wire 2 is buried on the inside of at least 0.01 mm from the surface of the seal resin of the seal portion 8. The wire 2 is thus prevented from being exposed in order to prevent corrosion of the wire 2. By thus burying the wire 2 inside, exposure of the wire 2 due to wear of the resin or the like is prevented. As a result, corrosion and breaking of the wire 2 is prevented. Furthermore, a distance between the seal portion 8 and an electrode pad 51 on the printed board 5 is set to at least 0.05 mm. As a result, the flux flow is not prevented at the time of cleaning, and smooth cleaning can be conducted. Furthermore, a nozzle (not illustrated) for transferring seal resin is moved to form the seal portion 8. Since the light nozzle is moved, therefore, the inertia is small and the resin can be applied to a predetermined range with high precision.

Furthermore, after the seal resin is applied, a low pressure (vacuum) is formed around it. Air contained in the seal resin is thus let get out to improve the quality. After this bubble removal, the seal resin is cured. By thus letting the air contained in the seal resin get out and then curing the resin, the density of the seal portion 8 is made uniform and its strength is raised. As a result, the quality can be improved.

Figure 5:
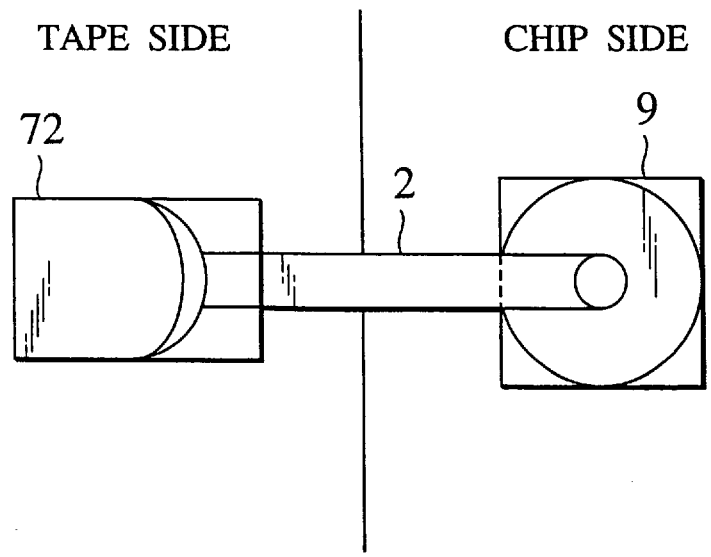
FIG. 5 is a diagram showing how to conduct wire bonding of wires illustrated in FIG. 2.

FIG. 5 is a diagram for describing how to conduct wire bonding of the wires 2 illustrated in FIG. 2. First of all, wire bonding of wires 2 of the IC chip side 1 is conducted, and thereafter wedge bonding of wires 2 of the tape 7 side is conducted. By doing so, the bonding portion of the IC chip 1 side is high, and the bonding portion of the tape 7 side can be kept low. As a result, the height of the wires 2 can be kept low, and dimensions shown in FIG. 4 can be implemented easily.

The diameter of the wires 2 is made to be in the range of 20 $\mu$m to 40 $\mu$m. If the wire diameter is 20 $\mu$m or less, stress generated by a temperature cycle described later tends to break the wires. If the wire diameter is at least 40 $\mu$m, then stress concentrates on the IC pads to which the wires are connected, and exfoliation occurs easily. Therefore, the diameter of the wires 2 in the range of 20 $\mu$m to 40 $\mu$m becomes the range of such an optimum diameter that the wires 2 are not affected by the stress caused by the temperature cycle.

Figure 6:
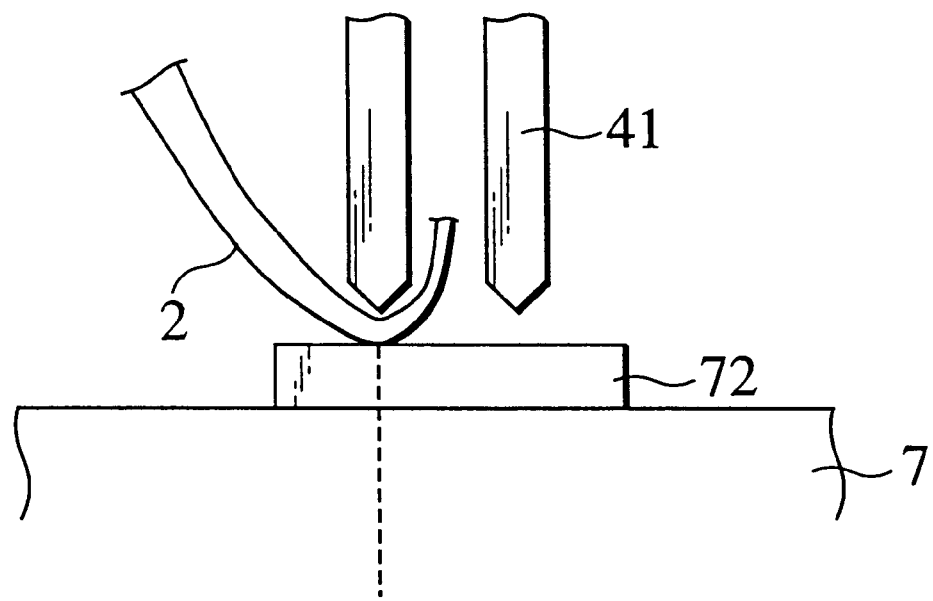
FIG. 6 is a diagram showing a state in which wires illustrated in FIG. 2 are subjected to wedge bonding with a bonding tool.
Figure 7:
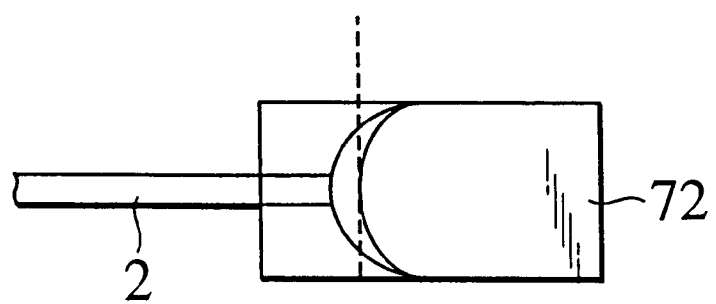
FIG. 7 is a top view showing the shape of an electrode pad of tape side illustrated in FIG. 2.

FIG. 6 shows a state in which wedge bonding is conducted on the wire 2 by using a bonding tool 41. FIG. 7 shows the shape of the electrode pad 72 of the tape 7 side at that time. By making the electrode pad 72 of the tape 7 side rectangular, the load of the bonding tool 41 is applied stably to the bonding portion of the wire 2, and in addition the required pad area can be made minimum.

Figure 8:
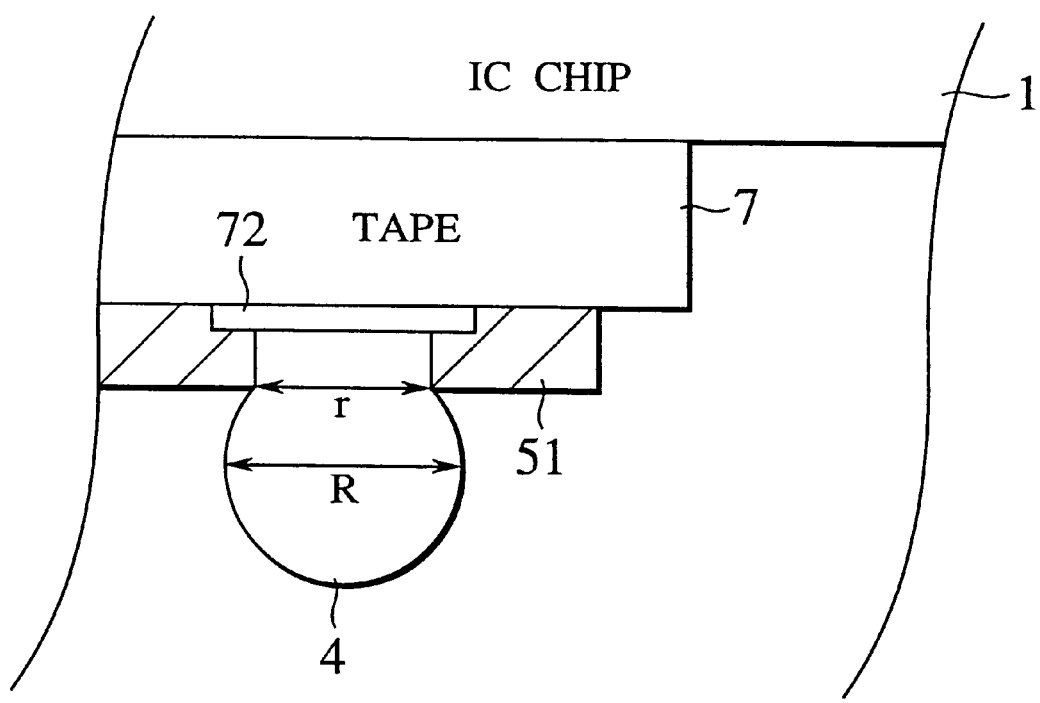
FIG. 8 is an enlarged view showing a mounting portion of a solder ball provided on the tape side illustrated in FIG. 2.

FIG. 8 is an enlarged view showing the mounting portion of a solder ball provided on the tape 7 side. A diameter R of the solder ball 4 is made larger than a land diameter r of a ball mounting portion provided on the tape 7. When sandwiching the solder ball 4 in a test socket terminal of sandwich type used at the time of test when construction of the semiconductor device has been finished, it becomes possible to make the test socket terminal grasp the solder ball 4 easily. Furthermore, a solder resist 51 is retreated from the edge of the tape 7 of the seal resin side, and a difference in level is provided between the solder resist 51 and the surface of the tape 7. As a result, it is possible to dam up the seal resin by the level difference when forming the seal portion 8, and prevent the seal resin from flowing out to unnecessary parts.

After the resin sealing of the wire bonding portion as described above has been conducted, the solder ball 4 is attached to the ball mounting portion of the tape 7. If they are conducted in the reverse order, then the flux used at the time of attaching the solder ball 4 contaminates the bonding electrode pads 9 of the IC chip 1, and cleaning is required at the time of wire bonding, resulting in an increase of an extra process. Furthermore, if the solder ball 4 is attached and thereafter potting and potting cure are conducted, then it is possible to prevent the mounted solder ball 4 from being contaminated by out gas generated at the timing of potting cure.

Figure 9:
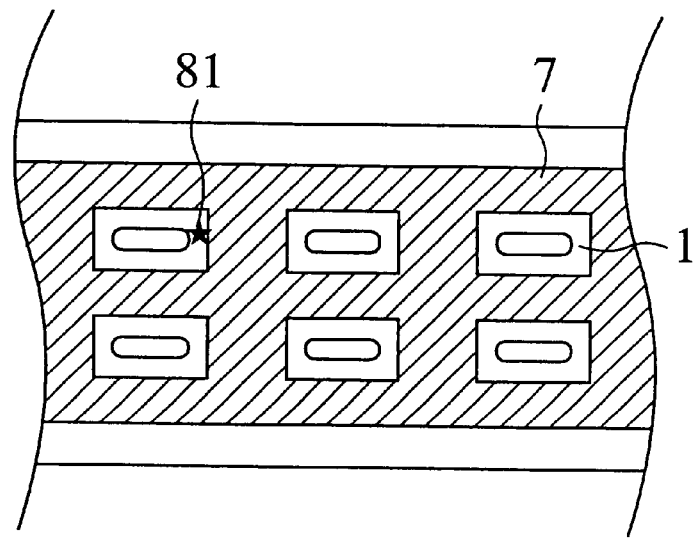
FIG. 9 is a diagram showing how to arrange a plurality of IC chips on the tape illustrated in FIG. 2.

FIG. 9 is a diagram showing how to arrange a plurality of IC chips 1 on the tape 7. In the present example, the IC chips 1 are arranged in two columns in a direction perpendicular to the longitudinal direction of the tape 7, and a plurality of IC chips 1 are arranged in a matrix form on the tape 7. As compared with the conventional case where the IC chips 1 are arranged in one column in the direction perpendicular to the longitudinal direction, therefore, it is possible to reduce the useless area of the tape 7, and execute the cut process and ball process simultaneously on the IC chips 1 of the two columns. Thus the process efficiency is increased, and the processing cost can be decreased.

Furthermore, space between a plurality of IC chips 1 is filled up by resin as shaded. This resin adheres to side planes of each IC chip. When each IC chip is cut off as described above, this resin forms the overhang portions 21 of each IC chip 21. In addition, if the interval between the IC chips 1 is determined appropriately, the hangover portions 21 are formed by simply cutting the IC chips as described above. As compared with the case where the IC chips 1 are not disposed at appropriate intervals and the hangover portions 21 are not formed by simply cutting, it is possible to reduce the number of times of dicing and cutting loss, improve the working efficiency, and reduce the working cost.

In the cut process, dicing is conducted first parallel to the longitudinal direction of the tape 7, and then dicing is conducted in a direction perpendicular to the longitudinal direction. Since a larger number of IC chips 1 are attached in the longitudinal direction of the tape 7, the number of times of dicing can be reduced by conducting the cutting as described above. At this time, by turning the tape 7 by 90 degrees instead of moving the cutter, the above described cut direction is changed. Thus cutting can be done in one stage, and in addition only one blade for dicing is needed.

Furthermore, the arrangement direction of the bonding electrode pads 9 of the IC chip 1 and the longitudinal direction of the tape 7 are aligned. In other words, the arrangement direction of the electrode pads 9 arranged in the center of the element plane of the IC chip 1 is aligned with the longitudinal direction of the tape 7. As a result, potting of the wire bonding portion can be conducted in one column along the longitudinal direction of the tape 7. Changes of direction in potting can thus be reduced, and the potting efficiency can be improved.

Furthermore, on the rear of the IC chip 1, a mark 81 for positioning at the time of mounting is provided. When aligning the ball electrode position of the IC chip 1 and the pattern of the printed board 5 with predetermined positions, the alignment can be conducted by making the mark as a reference and watching from the same plane. The mounting efficiency can thus be improved.

Figure 10:
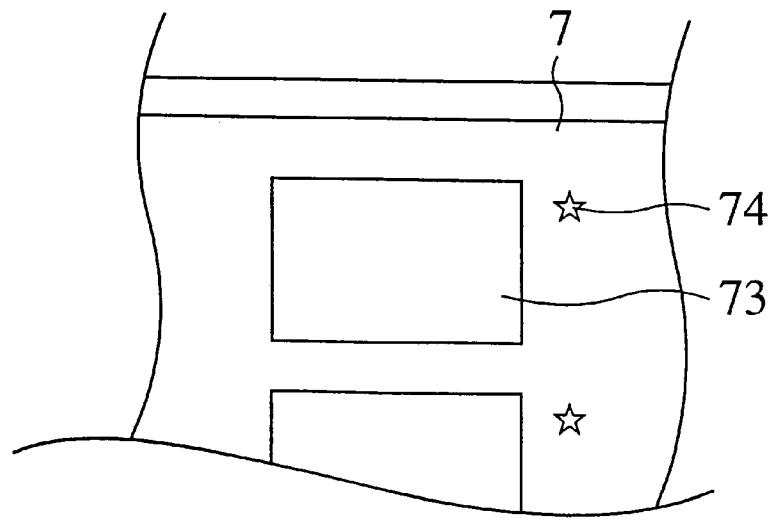
FIG. 10 is a diagram showing positions of positioning marks indicated on the tape illustrated in FIG. 2.

Furthermore, outside a wiring pattern 73 on the tape 7 as shown in FIG. 10, a mark 74 for positioning at the time of chip mount/ wire bonding/ solder ball mounting is provided. Since there is not the mark 74 in the wiring pattern 73, the mark does not become a hindrance, and the degree of freedom of the wiring pattern on the tape 7 can be obtained.

Figure 11:
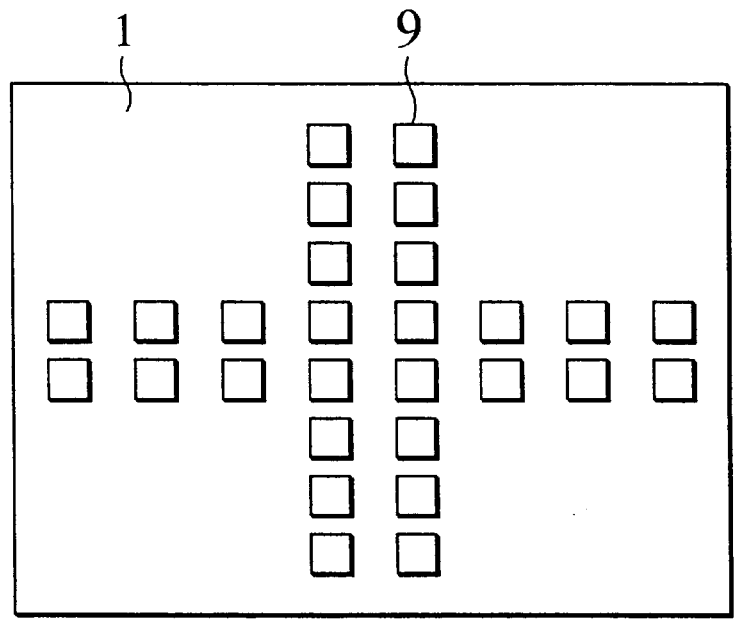
FIG. 11 is a top view showing an example of an arrangement of electrode pads for IC chip bonding illustrated in FIG. 2.

FIG. 11 is a top view showing an example of an arrangement of bonding electrode pads 9 on the IC chip 1. The electrode pads 9 are arranged in two columns and in two rows to so as to form a cross. This is capable of coping with a larger number of pins caused by a larger number of functions of the IC chip 1.

Figure 12:
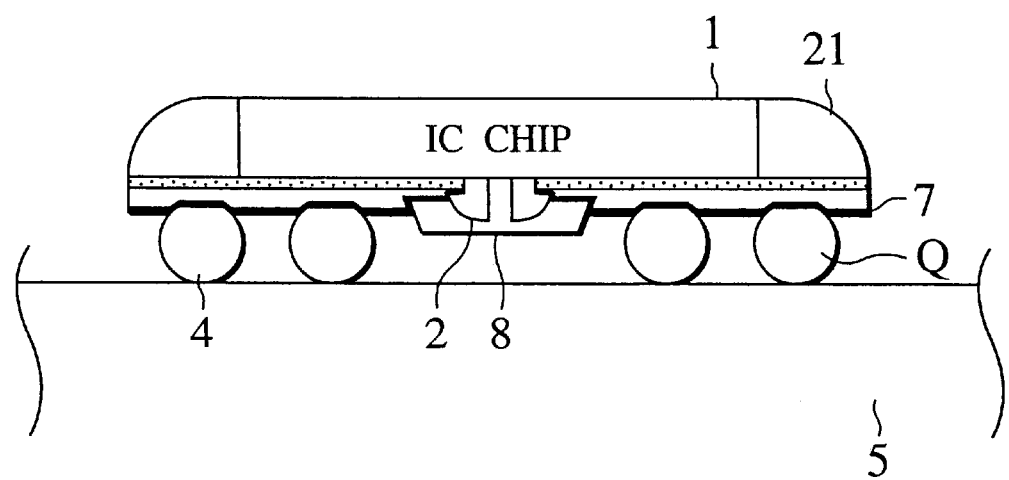
FIG. 12 is a sectional view showing the state in which a semiconductor device illustrated in FIG. 2 has been mounted on a printed board.

Endurance against the temperature cycle of the semiconductor device of the present embodiment will now be described. By soldering the solder balls 4, the above described semiconductor device is mounted on the printed board 5 as shown in FIG. 12. Thereafter, the printed board 5 is housed in a casing or the like of an electronic apparatus. As a result of repetition of operation and operation stop of the electronic apparatus, a temperature cycle formed by a temperature rise and a temperature drop in the casing occurs. At this time, a coefficient of thermal expansion of the IC chip 1 made of silicon is different from that of the printed board 5 made of resin. Therefore, stress is caused in a direction parallel to the plane of the printed board 5 by the difference.

Since the adhesive agent layer 6 has elasticity, however, the thermal stress is absorbed by the adhesive agent layer 6, and scarcely applied to the solder balls 4. Therefore, fatigue of a metal is scarcely caused in the solder balls 4. Even if the above described temperature cycle is repeated, such a crack as to open the electric connection between each solder ball 4 and the printed board 5 is not caused. The solder balls 4 can maintain electric connection with the printed board 5 stably over a long period of time. Here, an important matter is the elastic characteristic of the adhesive agent layer 6. It is necessary to consider which kind of adhesive agent can be actually used.

Figure 13:
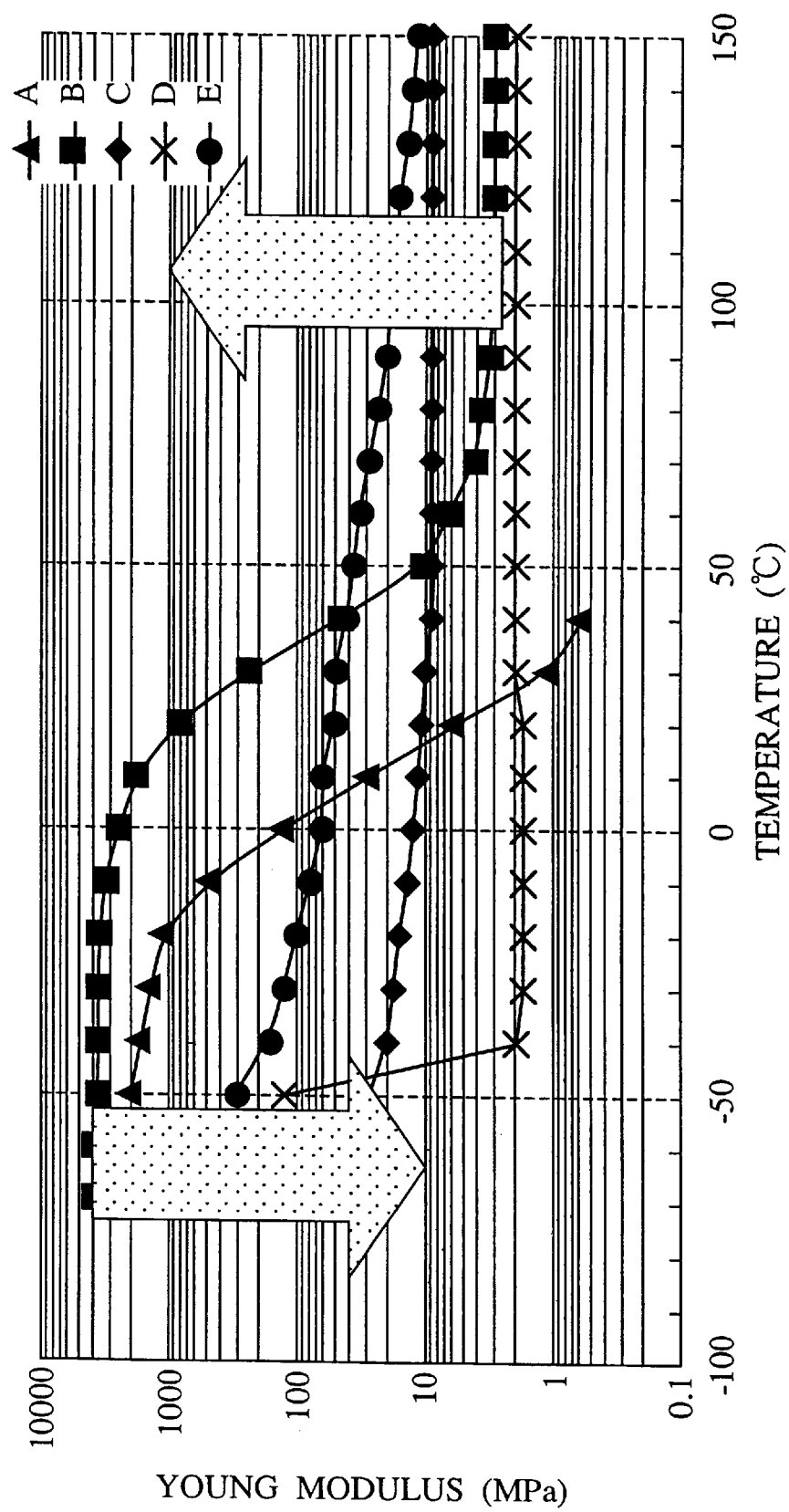
FIG. 13 is a diagram showing relations between temperature and Young's modulus values of respective adhesive agents obtained when printed boards mounting thereon semiconductor devices fabricated by using adhesive agents of five kinds and illustrated in FIG. 2 have been subjected to a TCT test.

FIG. 13 is a diagram showing relations between temperature and Young's modulus values of respective adhesive agents obtained when printed boards 5 mounting thereon semiconductor devices fabricated by using adhesive agents of five kinds and illustrated in FIG. 2 have been subjected to a TCT test. In FIG. 13, adhesive agents A (epoxy TR-9100 (trade name, the same will apply hereinafter), B(epoxy TSA-61), C (silicone DC-6910), D (silicone JCR6172) and E (silicone JCR6172) are denoted by triangles, squares, rhombuses, crosses, and circles, respectively. In all of them, the Young's modulus tends to become smaller as the temperature is raised.

Here, the following problem is posed. If the Young's modulus is too small, the adhesive agent layer 6 absorbs the bonding force too much when bonding the wire 2 to the tape 7. Thus there is a fear that suitable joint strength is not obtained and the wire 2 cannot be bonded to the tape 7 satisfactorily. Between 100° C. and 250° C. at the time of wire bonding, therefore, the adhesive agent layer 6 must hold certain supporting force. On the other hand, if the elasticity of the adhesive agent layer 6 is too small, the above described thermal stress cannot be absorbed.

FIG. 14 is a table diagram showing relations between Young's modulus values of respective adhesive agents and their joint strength values of wire bonding. As evident from FIG. 14, a sufficient joint strength value is obtained if the Young's modulus value is at least 1 MPa. If the temperature is in the range of 100° C. to 250° C. and the adhesive agent has a Young's modulus value of at least 1 MPa, therefore, the adhesive agent has a sufficient supporting force for joining the wire 2 to the electrode pad 72 of the tape 7 at the time of wire bonding.

FIG. 15 shows life test results of the TCT test of solder balls 4 of the semiconductor device illustrated in FIG. 2 and fabricated by using adhesive agents of five kinds. For example, as for the adhesive agent C, it is apparently found from the experiment results that the life is approximately 700 cycles. In this case, there has been obtained a conclusion that adhesive agents of all kinds can be adopted, and if the temperature is in the range of −65° C. to 120° C. and the adhesive agent has a Young's modulus value of 5000 MPa or less, the solder balls 4 have a practical life against fatigue of the metal caused by thermal stress.

By selecting whether a solder ball Q shown in FIG. 12 should be attached, the same chip 1 can be used either a function A or B.

In the present embodiment, the adhesive agent layer 6 is formed by using an adhesive agent having a Young's modulus value in the range of 1 MPa to 5000 MPa. After the semiconductor device has been mounted on the printed board 5 as shown in FIG. 12, a temperature cycle occurs and thermal stress is generated by a difference in coefficient of thermal expansion between the IC chip 1 and the printed board 5. However, this thermal stress is absorbed by the elasticity of the adhesive agent layer 6, and it is hardly applied to the solder balls 4. Even if the temperature cycle is repeated, therefore, little fatigue of the metal occurs in the solder balls 4. Thus the solder balls 4 can stably maintain electric connection with the wiring pattern of the printed board 5 over a long period of time. Reliability of an electronic circuit or the like using the semiconductor device of the present invention can be improved. Furthermore, by providing the overhang portions 21 with a Young's modulus in the range of 1 MPa to 5000 MPa, it is possible to absorb thermal stress caused by the temperature cycle in the overhang portions 21 as well and prevent the thermal stress from applying to the solder balls 4. In addition, it is possible to keep the overhang portions 21 from destruction such as occurrence of crack over a long period of time.

In addition, the area of the tape 7 can be expanded by the areas of the overhang portions 21 jointed around the IC chip 1. Without altering the size of the solder ball 4, therefore, the number of attached solder balls can be increased accordingly. It is thus possible to cope with an increase in the number of terminals caused by increased functions of the IC chip 1.

In the above described embodiment, the overhang portions 21 are formed on four side planes of the IC chip 1. Even if the overhang portions 21 are formed on two side planes of the IC chip 1, however, it is possible to increase the area of the tape 7, attach a larger number of solder balls without decreasing the size of the solder balls 4, and cope with an increased number of pins of the IC chip 1.

Figure 16:
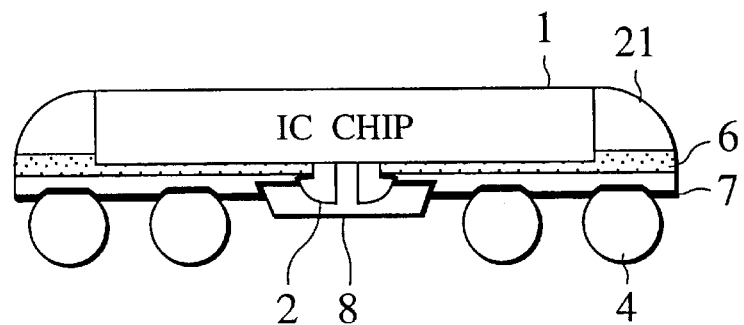
FIG. 16 is a sectional view showing another embodiment of a semiconductor device according to the present invention.

FIG. 16 is a sectional view showing another embodiment of a semiconductor device according to the present invention. A part of the element plane of the IC chip 1 is buried in the adhesive agent layer 6. Its remaining configuration is the same as that of the embodiment shown in FIG. 2.

In the present example, a part of the element plane of the IC chip 1 is buried in the adhesive agent layer 6. Even if external force is exerted, therefore, the IC chip is supported by internal wall planes of the adhesive agent layer 6, and the IC chip 1 is not shifted. As compared with the foregoing embodiment, the mechanical strength is improved and the reliability of the semiconductor device can be raised. Other effects are the same as those of the foregoing embodiment.

Figure 17:
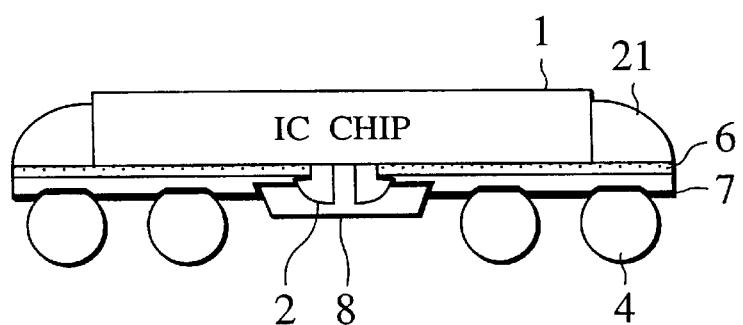
FIG. 17 is a sectional view showing still another embodiment of a semiconductor device according to the present invention.

FIG. 17 is a sectional view showing still another embodiment of a semiconductor device according to the present invention. By making the thickness of the hangover portions 21 thinner than the thickness of the IC chip 1, the top plane of the semiconductor device protrudes from the overhang portions 21. Its remaining configuration is the same as that of the embodiment shown in FIG. 2.

In the present example, the height of the IC chip 1 becomes higher than the height of the overhang portions 21. Although the load is applied to the top plane of the semiconductor device at the time of the test of the semiconductor device, therefore, all of the load is applied to the top plane of the IC chip uniformly. Since nonuniform load is not applied to the overhang portions 21 which are hard to be flattened, the overhang portions 21 are prevented from being cracked and destroyed thereby.

Figure 18:
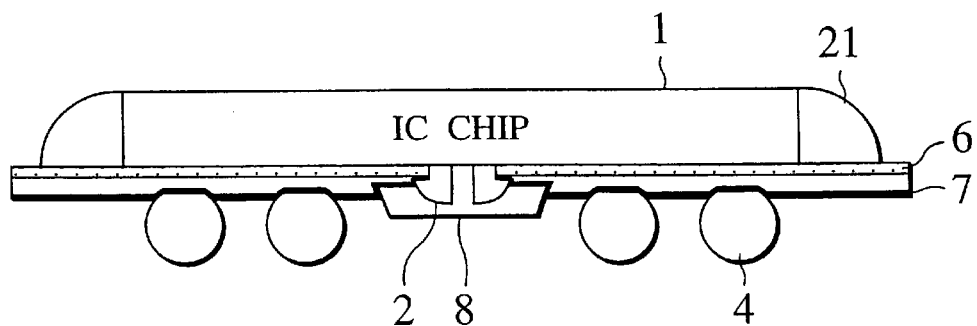
FIG. 18 is a sectional view showing yet another embodiment of a semiconductor device according to the present invention.

In the semiconductor device shown in FIG. 2, the area of the element plane of the IC chip 1 is made equal to the area of the tape 7 and the adhesive agent layer 6. However, they need not be necessarily the same. For example, as shown in FIG. 18, the area of the tape 7 and the adhesive agent layer 6 may be larger, and such a shape that they protrude from the IC chip 1 and the overhang portions 21 may also be used.

Figure 19A:
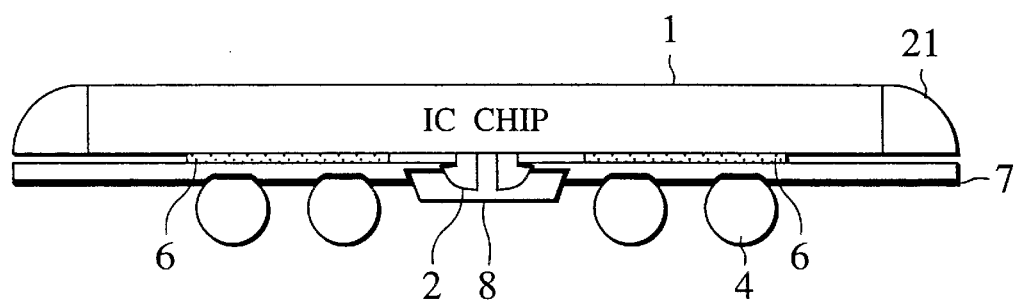
FIGS. 19A and 19B are a sectional view and a top view showing still yet another embodiment of a semiconductor device according to the present invention, respectively.
Figure 19B:
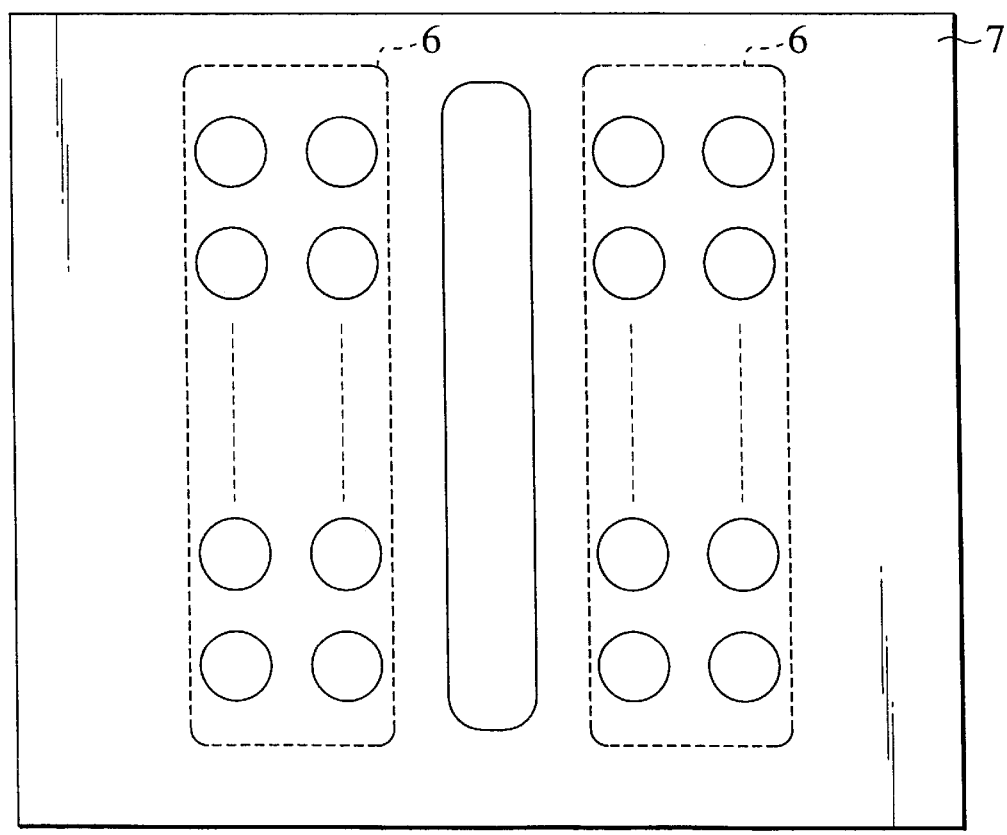

Furthermore, in the case where the solder balls concentrate on a part with respect to the element plane of the IC chip 1, the adhesive agent layer 6 need not necessarily be affixed to the whole element plane of the IC chip 1. Even in such a configuration that the adhesive agent layer 6 is affixed to only portions corresponding to portions of the solder balls 4 as shown in a sectional view of FIG. 19A and a top view of FIG. 19B, the effect is not changed.

As heretofore described in detail, a semiconductor device and its fabrication method according to the present invention makes it possible to stably maintain the electric connection between the printed board and the solder balls over a long period of time even if a temperature cycle is repeated and improve the reliability of the semiconductor device. In addition, a larger number of balls can be attached without reducing the size of the solder balls. It is possible to cope with an increase in the number of terminals of the semiconductor device at a low cost with solder balls having a standardized size.

It should be understood that many modifications and adaptations of the invention will become apparent to those skilled in the art and it is intended to encompass such obvious modifications and changes in the scope of the claims appended hereto.

What is claimed is:

1. A semiconductor device comprising:
   a semiconductor chip;
   overhang portions formed by hardening resin on side planes of said semiconductor chip;
   insulative tape having signal wiring and ball electrodes electrically connected to said signal wiring, on a main plane thereof;
   an adhesive agent layer having elasticity for indirectly sticking said semiconductor chip and said overhang portions to a back plane of said insulative tape in such a way that overall surfaces of said semiconductor chip and said overhang portions are stuck to the back plane through the adhesive agent layer; and
   an electric connection portion for electrically connecting said semiconductor chip to the signal wiring of said insulative tape.

2. A semiconductor device according to claim 1, wherein said adhesive agent layer has a Young's modulus value in the range of 1 MPa to 5000 MPa.

3. A semiconductor device according to claim 1, wherein said electric connection portion comprises wires for connecting electrode pads of said semiconductor chip to electrode pads disposed on the signal wiring of said insulative tape, and
a seal portion seals said electric connection portion with seal resin so as not to expose said wires.

4. A semiconductor device according to claim 3, wherein when said ball electrodes are soldered to electrode pads on a mounting board and thereby said semiconductor device is mounted on said mounting board, a gap between a top plane of said electrode pads and said seal portion is at least 0.05 mm.

5. A semiconductor device according to claim 3, wherein said wires are buried at least 0.01 mm from the surface of the seal resin of said seal portion.

6. A semiconductor device according to claim 3, wherein a plurality of electrode pads lined up in a straight line on said insulative tape and a plurality of electrode pads lined up in a straight line on said semiconductor chip are arranged in the same direction, and said plurality of electrode pads of said insulative tape are opposed to corresponding electrode pads of said plurality of electrode pads of said semiconductor chip with the same distance therebetween.

7. A semiconductor device according to claim 3, wherein each of said electrode pads on said signal wiring takes the shape of a rectangle.

8. A semiconductor device according to claim 3, wherein a mark for positioning at the time of wire bonding which can be watched from an opening portion for wire bonding or a dedicated opening portion provided in said insulative tape is indicated on said semiconductor chip.

9. A semiconductor device according to claim 3, wherein said electrode pads of said semiconductor chip are arranged in a straight line near a center of an element plane of said semiconductor chip.

10. A semiconductor device according to claim 3, wherein said electrode pads of said semiconductor chip are arranged near a center of an element plane of said semiconductor chip so as to form a cross, and a wire bonding hole is opened in said insulative tape so as to form a cross.

11. A semiconductor device according to claim 3, wherein outside a signal wiring area on said insulative tape, a mark for positioning at the time of chip mount, wire bonding and solder ball mounting is provided.

12. A method for fabricating a semiconductor device according to claim 3, said method comprising the step of conducting wire bonding of said wires to said electrode pads of each of said semiconductor chips and then conducting wire bonding of said wires to the electrode pads disposed on the signal wiring of said insulative tape.

13. A method for fabricating a semiconductor device according to claim 3, said method comprising the step of applying said seal resin to said electric connection portion by moving a resin ejecting nozzle and thereby forming the seal portion.

14. A method for fabricating a semiconductor device according to claim 3, said method comprising the step of applying said seal resin to said electric connection portion and then lowering the pressure around said seal resin.

15. A method for fabricating a semiconductor device according to claim 3, said method comprising the step of lowering the pressure around said seal resin and then curing said seal resin.

16. A method for fabricating a semiconductor device according to claim 3, said method comprising the step of sealing said electric connection portion and then attaching said ball electrodes to said insulative tape.

17. A method for fabricating a semiconductor device according to claim 3, said method comprising the step of bonding said wires to the electrode pads of said semiconductor chip and to the electrode pads of said insulative tape, and then sealing said electric connection portion with said seal resin.

18. A semiconductor device according to claim 3, wherein said wires are in the range of 20 to 40 $\mu$m in diameter.

19. A semiconductor device according to claim 1, wherein each of said overhang portions of said semiconductor chip has a thickness of at least 0.1 mm.

20. A semiconductor device according to claim 1, wherein upper corners of said overhang portions of said semiconductor chip are rounded off.

21. A semiconductor device according to claim 1, wherein said overhang portions of said semiconductor chip are made thinner in thickness than said semiconductor chip.

22. A semiconductor device according to claim 1, wherein each of said overhang portions of said semiconductor chip has a Young's modulus value in the range of 1 MPa to 5000 MPa.

23. A semiconductor device according to claim 1, wherein said overhang portions are formed on two or four side planes of said semiconductor chip.

24. A semiconductor device according to claim 1, wherein a part of said semiconductor chips buried in said adhesive agent layer.

25. A semiconductor device according to claim 1, wherein each of said ball electrodes is disposed on said insulative tape so that each of said ball electrodes will not be disposed on positions extending over both said semiconductor chip and said overhang portions.

26. A semiconductor device according to claim 1, wherein a mark for positioning at the time of mounting is indicated on either a back plane of said semiconductor chip or said overhang portions.

27. A semiconductor device according to claim 1, wherein a diameter of each of said ball electrodes is larger than a diameter of each of circular ball electrode mounting portions formed on the main plane of said insulative tape.

28. A semiconductor device according to claim 1, wherein an edge of a solder resist stuck to the main plane of said insulative tape is located in a position retreated from an edge of an opening portion for wire bonding formed in said insulative tape for the purpose of forming said electric connection portion.

29. A method for fabricating a semiconductor device according to claim 1, said method comprising the step of applying said adhesive agent of the same family as said resin forming said overhang portions to side planes of said semiconductor chip and then forming said overhang portions.

30. A method for fabricating a semiconductor device according to claim 1, said method comprising the step of arranging a plurality of said semiconductor chips in a direction perpendicular to a longitudinal direction of said insulative tape.

31. A method for fabricating a semiconductor device according to claim 30, wherein a line-up direction of electrode pads of said semiconductor chips coincides with the longitudinal direction of said insulative tape.

32. A method for fabricating a semiconductor device according to claim 1, said method comprising the step of arranging a plurality of said semiconductor chips on said insulative tape so as to form a matrix, and the step of dicing said tape in a longitudinal direction of said tape, and then dicing said tape in a direction perpendicular to said longitudinal direction, and thereby cutting off said semiconductor chips separately.

33. A method for fabricating a semiconductor device according to claim 32, said method comprising the step of hardening said resin between said plurality of said semiconductor chips arranged on said insulative tape, and the step of dicing said insulative tape together with said resin in the longitudinal direction of the tape, and then dicing said insulative tape together with said resin in a direction perpendicular to said longitudinal direction, and thereby cutting off said semiconductor chips separately.

34. A method for fabricating a semiconductor device according to claim 32, wherein when dicing said insulative tape, said tape is rotated by 90 degrees, and thereby the dicing direction is changed.

* * * * *